(12) United States Patent
Nakatani et al.

(10) Patent No.: US 7,898,044 B2
(45) Date of Patent: Mar. 1, 2011

(54) MEMS SENSOR AND PRODUCTION METHOD OF MEMS SENSOR

(75) Inventors: Goro Nakatani, Kyoto (JP); Mizuho Okada, Kyoto (JP); Nobuhisa Yamashita, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 12/923,446

(22) Filed: Sep. 22, 2010

(65) Prior Publication Data

US 2011/0012212 A1 Jan. 20, 2011

Related U.S. Application Data

(63) Continuation of application No. 12/219,449, filed on Jul. 22, 2008, now Pat. No. 7,825,483.

(30) Foreign Application Priority Data

Jul. 24, 2007 (JP) .................. 2007-192204

(51) Int. Cl.
*H01L 29/78* (2006.01)
(52) U.S. Cl. ........................................ 257/414; 257/419
(58) Field of Classification Search .................. 257/414, 257/419
See application file for complete search history.

(56) References Cited

U.S. PATENT DOCUMENTS

2007/0284682 A1 12/2007 Laming et al.

FOREIGN PATENT DOCUMENTS

WO WO-98/37388 8/1998

*Primary Examiner* — Douglas M Menz
(74) *Attorney, Agent, or Firm* — Rabin & Berdo, PC

(57) ABSTRACT

An MEMS sensor of the present invention includes a substrate, a lower thin film provided on a surface of the substrate, an upper thin film opposed to the lower thin film at an interval on the side opposite to the substrate, and a wall portion surrounding the lower thin film and the upper thin film and protruding on the side opposite to the lower thin film with respect to the upper thin film.

13 Claims, 21 Drawing Sheets

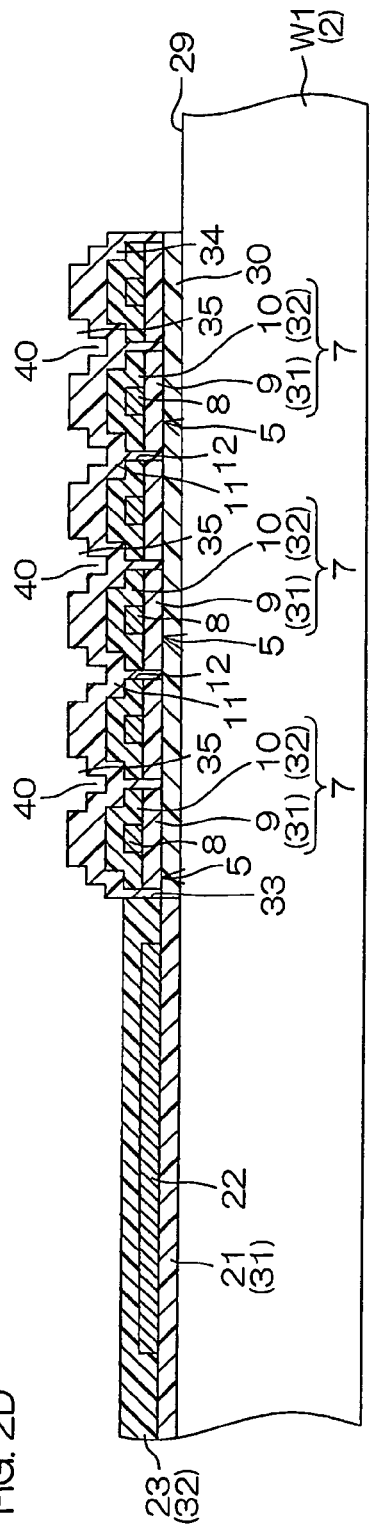

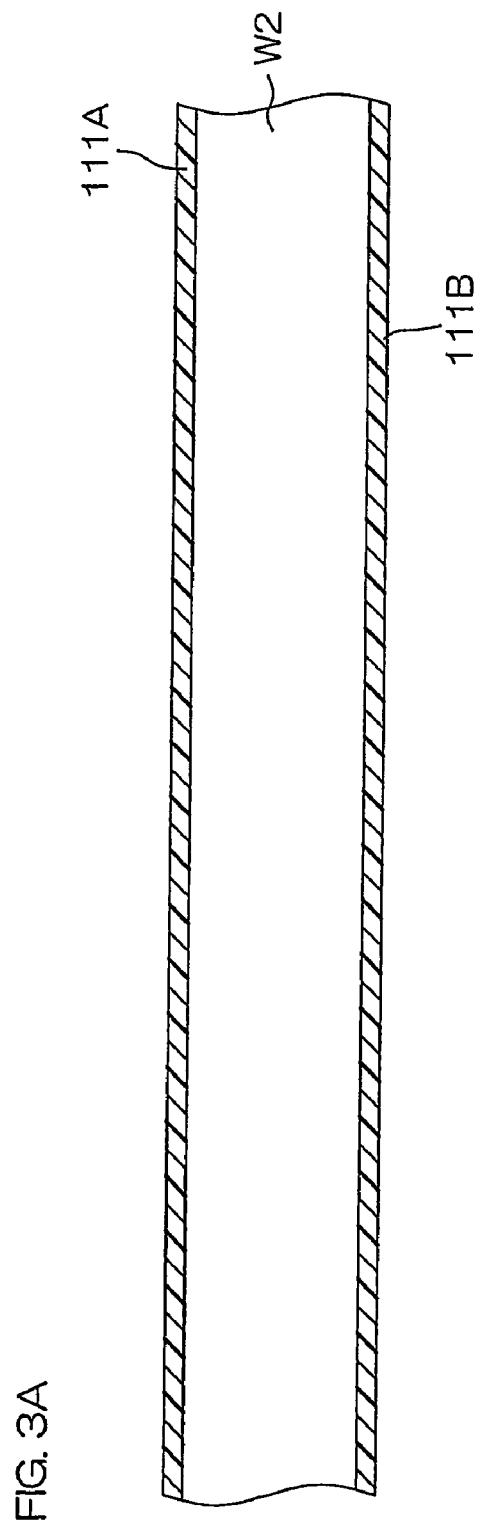

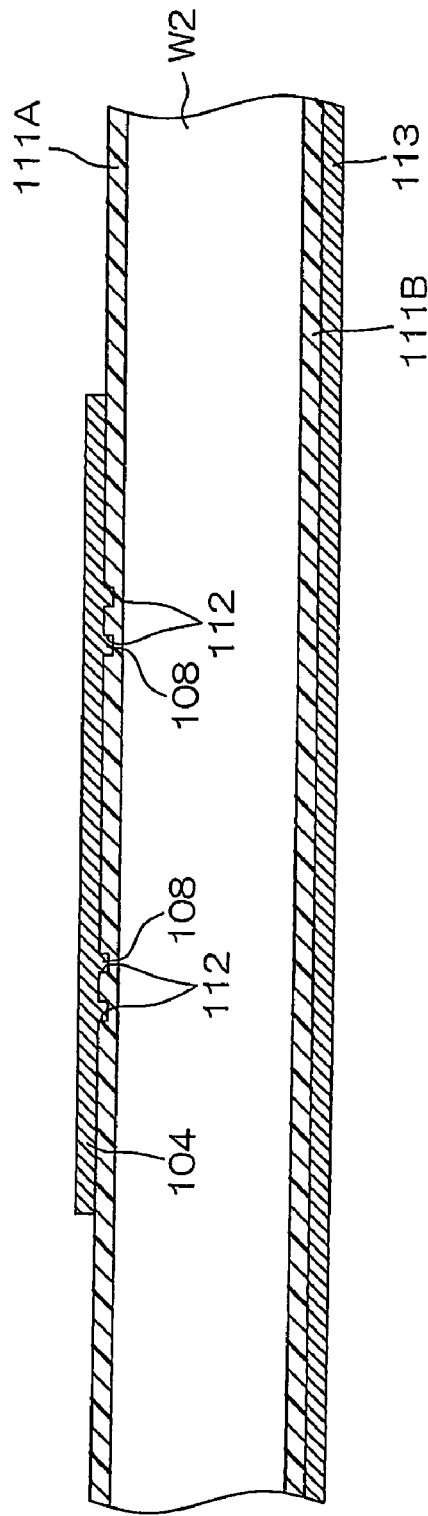

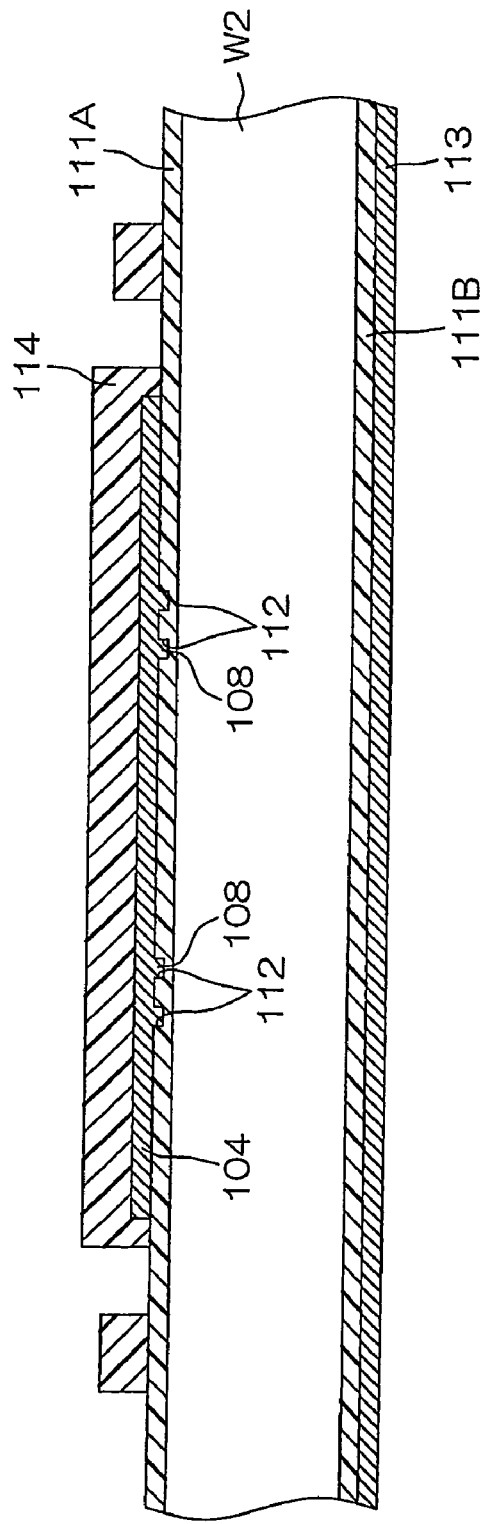

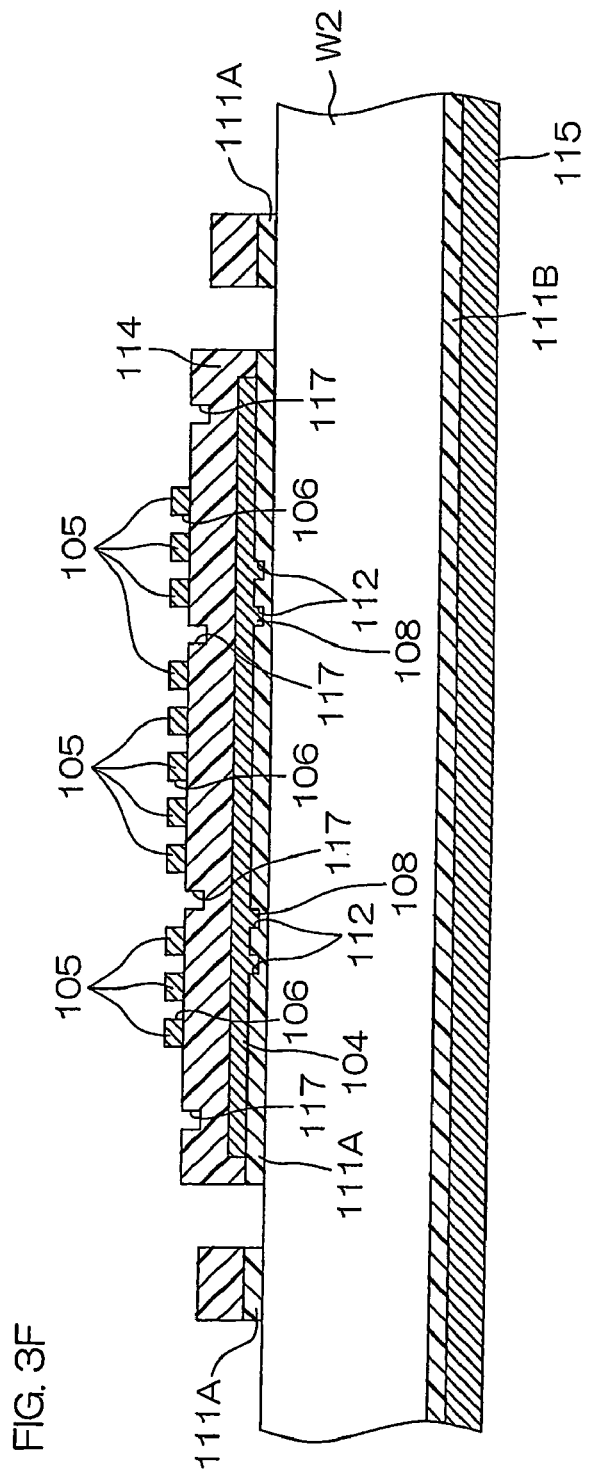

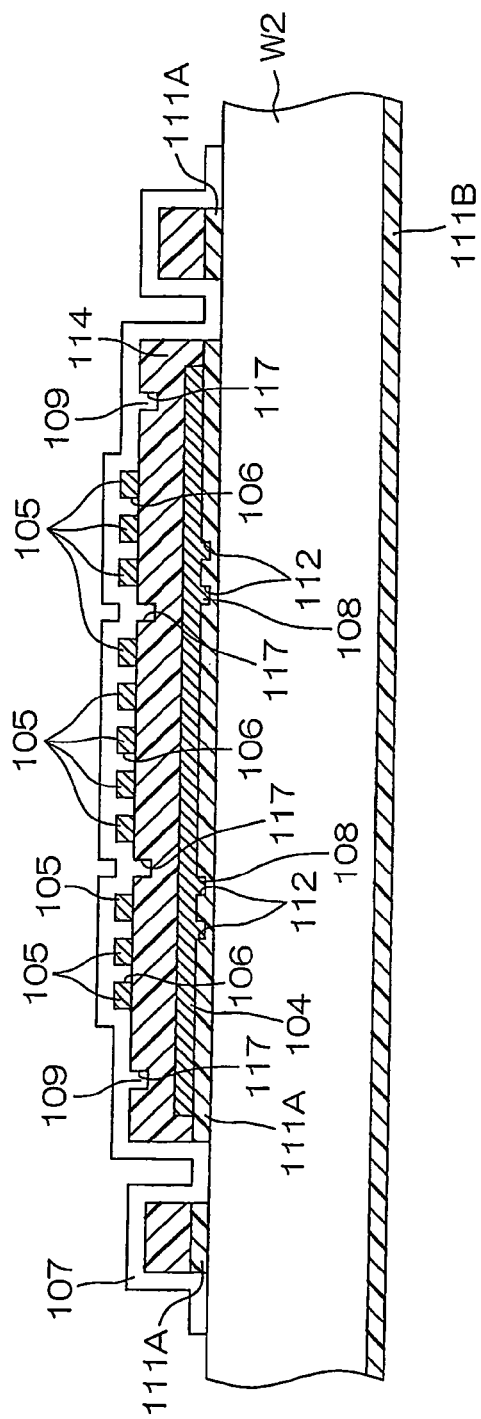

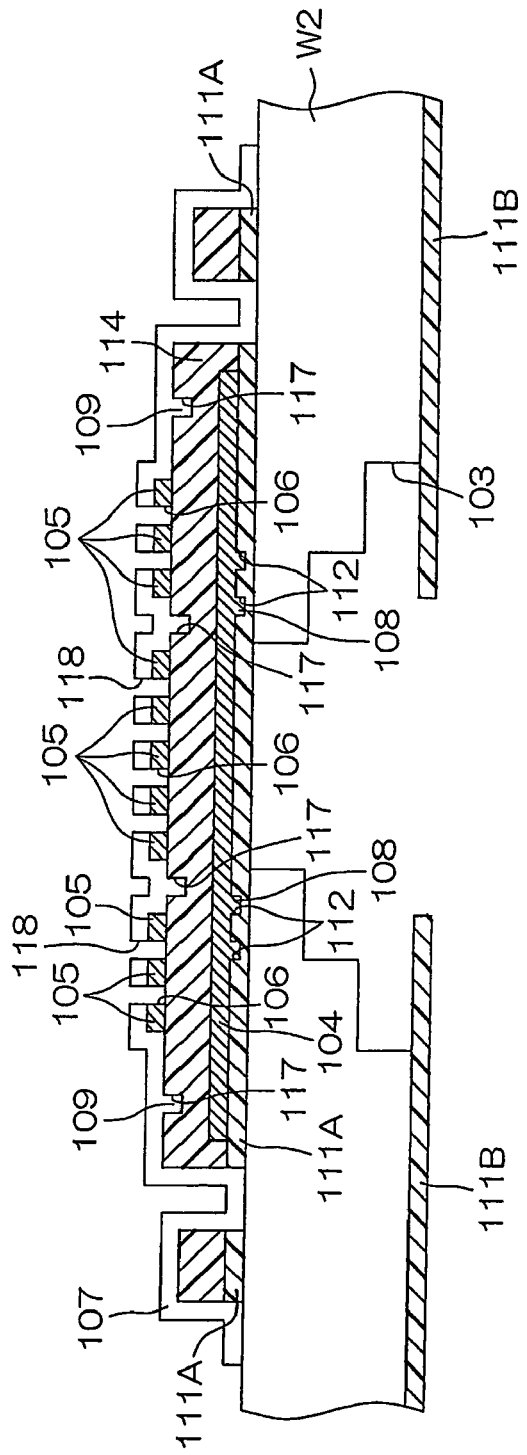

MEMS SENSOR AND PRODUCTION METHOD OF MEMS SENSOR

This is a Continuation of U.S. application Ser. No. 12/219, 449, filed Jul. 22, 2008 now U.S. Pat. No. 7,825,483, and allowed on Jun. 25, 2010, the subject matter of which is incorporated herein by reference.

BACKGROUND OF THE INVENTION

1. Field of the Invention

The present invention relates to an MEMS sensor and a production method thereof.

2. Description of Related Art

In recent years, an MEMS sensor such as an Si (silicon) microphone produced by MEMS (Micro Electro Mechanical Systems) has been employed as a microphone loaded on a portable telephone or the like.

FIGS. 3A to 3I are schematic sectional views successively showing the steps of producing a conventional Si microphone 101. The method of producing the conventional Si microphone 101 and the structure thereof are now described with reference to FIGS. 3A to 3I.

In order to produce the conventional Si microphone 101, $SiO_2$ (silicon oxide) films 111 (111A and 111B formed on the upper and lower surfaces of an Si wafer W2 respectively) are formed on the overall surfaces of the Si wafer W2 by thermal oxidation, as shown in FIG. 3A.

Then, a plurality of (four in FIG. 3B) recesses 112 are formed in the upper surface of the $SiO_2$ film 111A by well-known photolithography and etching, as shown in FIG. 3B.

Then, polysilicon is deposited on the overall surfaces of the $SiO_2$ films 111 by LPCVD (Low Pressure Chemical Vapor Deposition). The polysilicon film covering the $SiO_2$ film 111A is doped with phosphorus, and portions of this polysilicon film other than that present on a prescribed region including the plurality of recesses 112 are thereafter removed by well-known photolithography and etching. Thus, a thin-film polysilicon plate 104 is formed on the prescribed region of the $SiO_2$ film 111A, as shown in FIG. 3C. Further, a polysilicon film 113 is formed on the $SiO_2$ film 111B.

Then, $SiO_2$ is deposited on the overall surfaces of the $SiO_2$ film 111A and the polysilicon plate 104 by PECVD (Plasma Enhanced Chemical Vapor Deposition). Then, unnecessary portions of the deposited $SiO_2$ film are removed by well-known photolithography and etching. Thus, a sacrificial layer 114 is formed on the polysilicon plate 104 and a region around the same, as shown in FIG. 3D.

Then, polysilicon is deposited on the $SiO_2$ film 111A, the sacrificial layer 114 and the polysilicon film 113 by LPCVD (Low Pressure Chemical Vapor Deposition). Thus, the polysilicon film deposited on the polysilicon film 113 and the polysilicon film 113 are integrated into a polysilicon film 115, as shown in FIG. 3E. On the other hand, the polysilicon film deposited on the $SiO_2$ film 111A and the sacrificial layer 114 is doped with phosphorus, and thereafter patterned by well-known photolithography and etching. Thus, a thin-film back plate 105 having a large number of holes 106 is formed on the sacrificial layer 114, as shown in FIG. 3E.

Then, a plurality of (four in FIG. 3F) recesses 117 are formed in the upper surface of the sacrificial layer 114 by well-known photolithography and etching, as shown in FIG. 3F. Further, unnecessary portions (other than that opposed to the sacrificial layer 114) of the $SiO_2$ film 111A are removed.

Then, an SiN (silicon nitride) film 107 is formed by PECVD to cover the sacrificial layer 114, as shown in FIG. 3G.

Then, holes 118 communicating with the holes 106 of the back plate 105 are formed in the SiN film 107 by well-known photolithography and etching, as shown in FIG. 3H. Thus, the sacrificial layer 114 is partially exposed through the holes 106 and 118. Further, an opening is formed in a portion of the $SiO_2$ film 111B opposed to the polysilicon plate 104 by well-known photolithography and etching. The Si wafer W2 is so etched through this opening that a through-hole 103 is formed therein. Consequently, the $SiO_2$ film 111A is partially exposed through the through-hole 103.

Then, an etching solution capable of etching $SiO_2$ is supplied through the through-hole 103 and the holes 106 and 118, to wet-etch the sacrificial layer 114 and the $SiO_2$ film 111A. Thus, the polysilicon plate 104 floats up from the upper surface of the Si wafer W2 while a cavity 110 of a small interval is formed between the polysilicon plate 104 and the back plate 105, as shown in FIG. 3I.

Thereafter the Si wafer W2 is diced into an Si substrate 102 of each device size, whereby the Si microphone 101 is obtained with the polysilicon plate 104 and the back plate 105 opposed to each other through the cavity 110. Portions of the SiN film 107 having entered the recesses 117 of the sacrificial layer 114 become protrusions 109 protruding toward the polysilicon plate 104, to function as stoppers for preventing the polysilicon plate 104 and the back plate 105 from adhesion and a short circuit. Further, portions of the polysilicon plate 104 having entered the recesses 112 of the $SiO_2$ film 111A become protrusions 108 protruding toward the upper surface of the Si wafer W2, to function as stoppers for preventing the Si substrate 102 and the polysilicon plate 104 from adhesion. The polysilicon plate 104 and the back plate 105 are supported by unshown wires.

In this Si microphone 101, the polysilicon plate 104 and the back plate 105 covered with the SiN film 107 form a capacitor portion 120 opposed through the cavity 110. When a sound pressure (sound wave) is input in the Si microphone 101 from above the back plate 105, the back plate 105 and the polysilicon plate 104 vibrate due to this sound pressure, and the capacitor portion 120 outputs an electric signal responsive to a change of the capacitance of the capacitor portion 120 resulting from this vibration of these plates 104 and 105.

In the Si wafer W2, the capacitor portion 120 is formed by the thin-film polysilicon plate 104 and the thin-film back plate 105. Therefore, the capacitor portion 120 may be deformed or broken by coming into contact with another substance.

When water for removing frictional heat (cooling) is supplied to a dicing saw in a dicing step, for example, the water hits the capacitor portion 120, to deform or break the capacitor portion 120 by this shock. If a dicing tape is bonded to the capacitor portion 120, the capacitor portion 120 is broken when the dicing tape is separated therefrom. Therefore, neither the dicing saw nor the dicing tape can be employed, but a specific technique such as laser dicing must be employed for dicing the Si wafer W2.

When the Si microphone 101 is carried or a system employing the Si microphone 101 is assembled after the Si wafer W2 is diced into each device size, a semiconductor device or the like mixedly provided on the system may come into contact with the capacitor portion 120, to deform or break the capacitor portion 120.

SUMMARY OF THE INVENTION

One aspect of the present invention may provide an MEMS sensor capable of protecting a thin-film structure provided on a substrate and a production method thereof.

An MEMS sensor of the present invention includes: a substrate; a lower thin film provided on a surface of the substrate; an upper thin film opposed to the lower thin film at an interval on the side opposite to the substrate; and a wall portion surrounding the lower thin film and the upper thin film and protruding on the side opposite to the lower thin film with respect to the upper thin film.

A production method of an MEMS sensor of the present invention, including the steps of: forming a lower thin film on a surface of a substrate; forming a sacrificial layer on the lower thin film; forming an upper thin film having a plurality of upper through-holes extending in the thickness direction respectively on the sacrificial layer; forming a wall portion surrounding the lower thin film and the upper thin film and protruding on the side opposite to the lower thin film with respect to the upper thin film; and removing the sacrificial layer by etching through the upper through-holes.

The MEMS sensor according to the present invention can be prepared by the production method according to the present invention, for example.

According to this production method, the lower thin film is formed on the surface of the substrate. The sacrificial layer is formed on the lower thin film. The upper thin film having the plurality of upper through-holes extending in the thickness direction respectively is formed on the sacrificial layer. The wall portion surrounding the lower thin film and the upper thin film and protruding on the side opposite to the lower thin film with respect to the upper thin film is formed around the lower thin film and the upper thin film. The sacrificial layer is removed by etching through the upper through-holes.

The wall portion is formed around the lower thin film and the upper thin film. Therefore, by determining the height of the wall portion to the appropriate height, the top face of the wall portion can be arranged above the upper surface of the upper thin film. When the substrate is diced, therefore, a dicing tape can be bonded to the top face of the wall portion without bringing the same into contact with the upper thin film and/or the lower thin film. The dicing tape bonded to the top face of the wall portion does not come into contact with the upper thin film and/or the lower thin film, whereby the upper thin film and/or the lower thin film is neither deformed nor broken when the dicing tape is separated from the wall portion. Further, the dicing tape is so bonded to the top face of the wall portion surrounding the lower thin film and the upper thin film that the lower thin film and the upper thin film can be covered with the wall portion and the dicing tape. When the substrate is diced with a dicing saw, therefore, water for cooling the dicing saw can be prevented from splashing the lower thin film and the upper thin film. In other words, a thin-film structure formed by the upper and lower thin films provided on the substrate can be protected against the dicing tape and the water for cooling the dicing saw.

Therefore, the substrate can be diced by a general method employing a dicing tape and a dicing saw.

The MEMS sensor according to the present invention can be obtained by leaving the wall portion around the lower thin film and the upper thin film after production of the MEMS sensor. This MEMS sensor includes the wall portion around the lower thin film and the upper thin film, whereby the thin-film structure formed by the upper and lower thin films can be protected when the MEMS sensor is carried or a system is assembled with this MEMS sensor, for example.

The aforementioned wall portion is preferably made of a photosensitive material. In this case, the photosensitive material can be patterned by well-known exposure and well-known development, whereby the wall portion can be simply formed.

The aforementioned wall portion is more preferably made of polyimide, among photosensitive materials. Polyimide is excellent in shock resistance, heat resistance and insulation resistance. Therefore, the wall portion can be suitably utilized as a surface protective film covering the surface of the MEMS sensor.

If the wall portion is made of a material resistant against an etching solution or etching gas for etching the sacrificial layer, the wall portion may be utilized as an etching mask in the step of removing the sacrificial layer included in the steps of producing the MEMS sensor.

BRIEF DESCRIPTION OF THE DRAWINGS

FIGS. 2A to 2K are schematic sectional views successively showing the steps of producing the Si microphone shown in FIG. 1.

FIGS. 3A to 3I are schematic sectional views successively showing the steps of producing a conventional Si microphone.

DETAILED DESCRIPTION OF THE INVENTION

Figure 1:
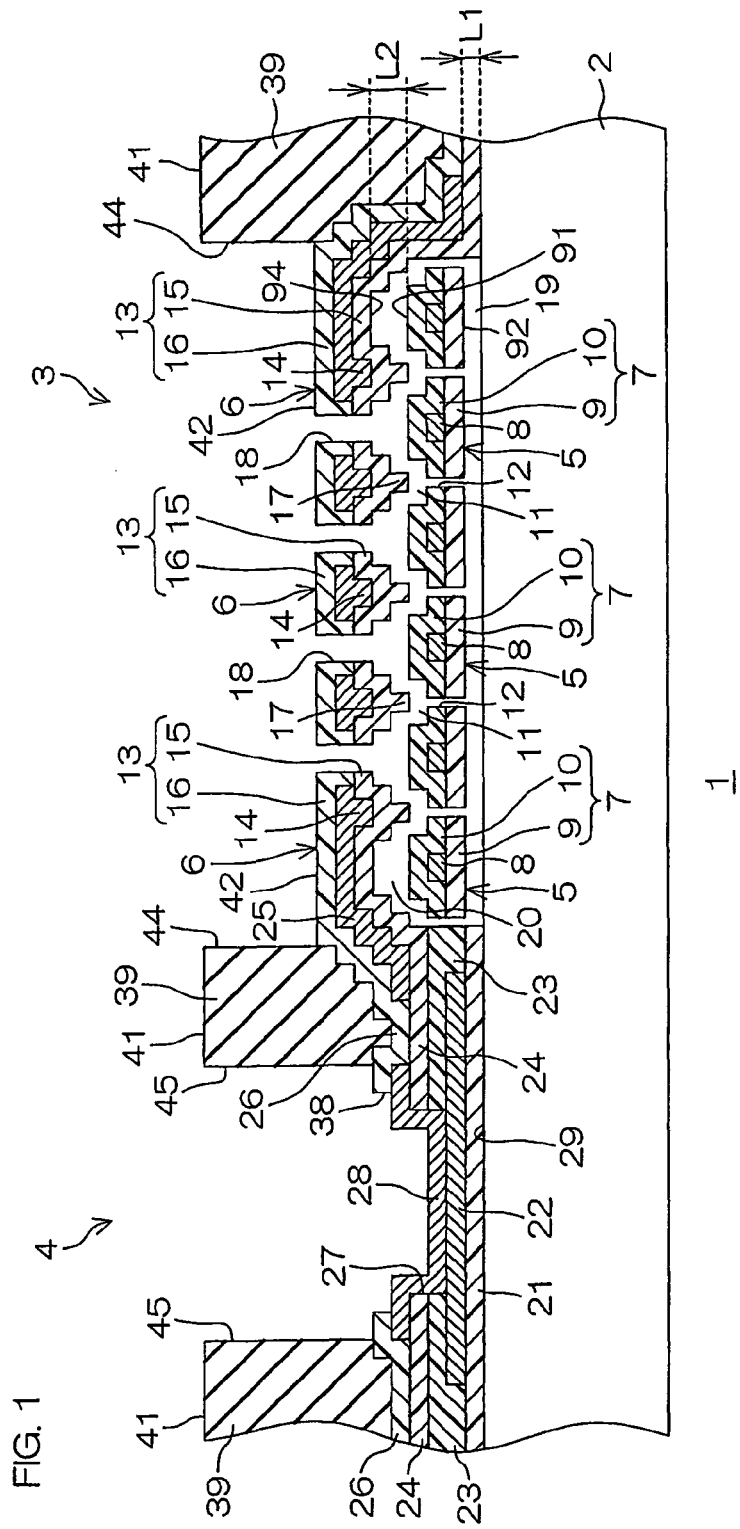
FIG. 1 is a schematic sectional view of an Si microphone according to an embodiment of the present invention.

FIG. 1 is a schematic sectional view of an Si microphone 1 according to an embodiment of the present invention.

The Si microphone 1 is a capacitance type sensor (MEMS sensor) operating by sensing a change in capacitance. This Si microphone 1 has a sensor portion 3 and a pad portion 4 on an Si substrate 2.

The sensor portion 3 senses a sound pressure input in the Si microphone 1, and outputs a change of capacitance responsive to the magnitude of the sound pressure to a wire 22 (described later) as an electric signal.

The sensor portion 3 includes a lower thin film 5 opposed to a surface (hereinafter referred to as an upper surface 29) of the Si substrate 2 at an interval and an upper thin film 6 arranged above the lower thin film 5 to be opposed thereto at an interval.

The lower thin film 5 includes a lower thin film insulating layer 7 and a lower electrode 8 covered with the lower thin film insulating layer 7.

The lower thin film insulating layer 7 includes a first insulating layer 9 forming a lower layer of the lower tin film insulating layer 7 and a second insulating layer 10 formed on the first insulating layer 9 as an upper layer of the lower thin film insulating layer 7.

The first insulating layer 9 is formed integrally with a first insulating layer 21 (described later) of the pad portion 4.

The second insulating layer 10 is formed integrally with a second insulating layer 23 (described later) of the pad portion 4. A plurality of recesses 11 are formed in the second insulating layer 10. The plurality of recesses 11 are arranged in the form of a matrix with m rows and n columns (m and n denote natural numbers) as a whole, for example.

The lower thin film insulating layer 7 is provided with lower through-holes 12 passing through the lower thin film insulating layer 7 in the thickness direction thereof from the bottom surfaces of the recesses 11. Thus, the lower thin film insulating layer 7 is in the form of a rectangular mesh in plan view, with the lower through-holes 12 provided in the form of a matrix in plan view.

The lower electrode 8 is made of a conductive material such as Au or Al, for example, and Al is applied in this embodiment. The lower electrode 8 is in the form of a rectangular mesh in plan view. This lower electrode 8 is arranged on the upper surface of the first insulating layer 9. The side surfaces and the upper surface of the lower electrode 8 are covered with the second insulating layer 10. In other words, the lower electrode 8 is held between the lower first insulating layer 9 and the upper second insulating layer 10 in the lower thin film 5, so that the overall surfaces thereof are covered with the lower thin film insulating layer 7. The second insulating layer 10 is so formed on the mesh lower electrode 8 that the surface thereof protuberates on portions opposed to the lower electrode 8 and has the recesses 11 in portions not opposed to the lower electrode 8. The lower electrode 8 is supported by the wire 22 (described later) on an unshown position at a prescribed interval from the upper surface 29 of the Si substrate 2. Thus, the lower thin film 5 formed by covering the lower electrode 8 with the lower thin film insulating layer 7 is opposed to the Si substrate 2 through a cavity 19 of a small interval L1 (the distance between the upper surface 29 of the Si substrate 2 and the lower surface 92 of the lower thin film insulating layer 7 (first insulating layer 9) is 1 mm, for example).

The upper thin film 6 includes an upper thin film insulating layer 13 and an upper electrode 14 covered with this upper thin film insulating layer 13.

The upper thin film insulating layer 13 includes a third insulating layer 15 forming a lower layer of the upper thin film insulating layer 13 and a fourth insulating layer 16 formed on the third insulating layer 15 as an upper layer of the upper thin film insulating layer 13.

The third insulating layer 15 is formed integrally with a third insulating layer 24 (described later) of the pad portion 4. The third insulating layer 15 is provided with protrusions 17 protruding toward the recesses 11 (lower through-holes 12) on portions opposed to the recesses 11 (lower through-holes 12) in a lower surface 94 opposed to the lower thin film 5.

The fourth insulating layer 16 is formed integrally with a fourth insulating layer 26 (described later) of the pad portion 4.

The upper thin film insulating layer 13 is provided with a plurality of upper through-holes 18 passing through the upper thin film insulating layer 13 in the thickness direction thereof.

The upper through-holes 18 are arranged on positions (between the adjacent ones of the lower through-holes 12 in plan view, for example) deviating from the lower through-holes 12 respectively.

The upper electrode 14 is made of a conductive material such as Au or Al, for example, and Al is applied in this embodiment. The upper electrode 14 is in the form of a rectangular mesh in plan view. This upper electrode 14 is arranged on the third insulating layer 15. The side surfaces and the upper surface of the upper electrode 14 are covered with the fourth insulating layer 16. In other words, the upper electrode 14 is held between the lower third insulating layer 15 and the upper fourth insulating layer 16 in the upper thin film 6, so that the overall surfaces thereof are covered with the upper thin film insulating layer 13. The upper electrode 14 is supported by a wire 25 (described later) at a prescribed interval from the upper surface of the lower thin film 5 (upper surface 91 of the second insulating layer 10). Thus, the upper thin film 6 formed by covering the upper electrode 14 with the upper thin film insulating layer 13 is opposed to the lower thin film 5 through a cavity 20 of a small interval L2 (the distance between the upper surface 91 of the second insulating layer 10 and the lower surface 94 of the upper thin film insulating layer 13 (third insulating layer 15) is 4 μm, for example).

The upper thin film 6 is opposed to the lower thin film 5 through the cavity 20 of the small interval L2, and forms a capacitor whose capacitance changes due to vibration, along with the lower thin film 5. In other words, the sensor portion 3 is formed by the lower thin film 5 and the upper thin film 6 opposed to each other through the cavity 20. When a sound pressure (sound wave) is input in the sensor portion 3, the upper thin film 6 and/or the lower thin film 5 vibrates due to this sound pressure, and the sensor portion 3 outputs an electric signal responsive to a change of the capacitance of the capacitor resulting from this vibration of the upper thin film 6 and/or the lower thin film 5 to the wire 22 (described later).

The pad portion 4 outputs the electric signal received from the sensor portion 3 to an external wire.

The pad portion 4 includes the first insulating layer 21, the wire 22, the second insulating layer 23, the third insulating layer 24, the wire 25 and the fourth insulating layer 26.

The first insulating layer 21 is formed on the upper surface 29 of the Si substrate 2.

The wire 22 is formed on the first insulating layer 21 in a prescribed pattern. The wire 22 is formed integrally with the lower electrode 8 and electrically connected with the wire 25 on an unshown position.

The second insulating layer 23 is formed on the first insulating layer 21, and covers the wire 22 along with the first insulating layer 21.

The third insulating layer 24 is formed on the second insulating layer 23.

The wire 25 is formed on the third insulating layer 24 in a prescribed pattern. The wire 25 is formed integrally with the upper electrode 14, and electrically connected with the wire 22 on an unshown position.

The second and third insulating layers 23 and 24 are provided with an opening 27 passing through these layers 23 and 24 in the thickness direction thereof. The opening 27 is formed to partially expose the wire 22 as a bonding pad.

A metal thin film 28 covering the part of the wire 22 exposed from the opening 27 is formed on the opening 27. The metal thin film 28 is made of a conductive material such as Au or Al, for example, and Al is applied in this embodiment. An electric wire (not shown) for electrically connecting the Si microphone 1 with an external IC chip (not shown) processing the electric signal, for example, is connected to the metal thin film 28.

The fourth insulating layer 26 is formed on the third insulating layer 24. The fourth insulating layer 26 is provided with an opening 38 partially exposing the metal thin film 28.

The Si microphone 1 further includes a protective layer 39 (wall portion).

The protective, layer 39 is made of photosensitive polyimide (positive photosensitive polyimide in this embodiment), for example. The protective layer 39 is so formed as to surround the sensor, portion 3 and the pad portion 4 on the upper surfaces of the fourth insulating layers 16 and 26, and has openings 44 and 45 exposing the sensor portion 3 and the pad portion 4 respectively. Further, the protective layer 39 is so formed that the distance (height of the protective layer 39) between the upper surface 41 thereof and the Si substrate 2 is greater (higher) than the distance (height of the fourth insulating layer 16) between the upper surface 42 of the fourth insulating layer 16 and the Si substrate 2.

FIGS. 2A to 2K are schematic sectional views successively showing the steps of producing the Si microphone 1 shown in FIG. 1.

In order to produce the Si microphone 1, Al (aluminum) is deposited on a surface (upper surface 29) of a discoidal Si wafer W1 forming the matrix of the Si substrate 2 by PECVD (Plasma Enhanced Chemical Vapor Deposition), for example.

Figure 2A:
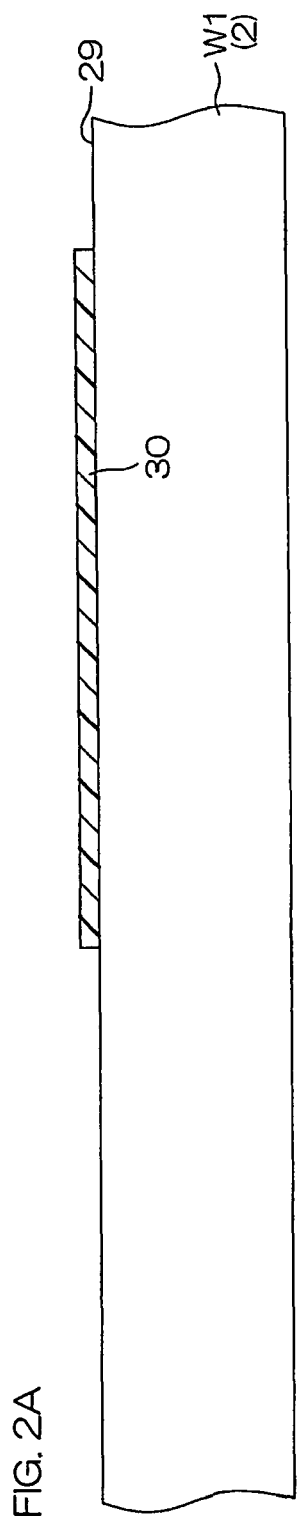

Then, this Al film is patterned by well-known photolithography and etching to form a lower sacrificial layer 30 made of Al, as shown in FIG. 2A.

Figure 2B:
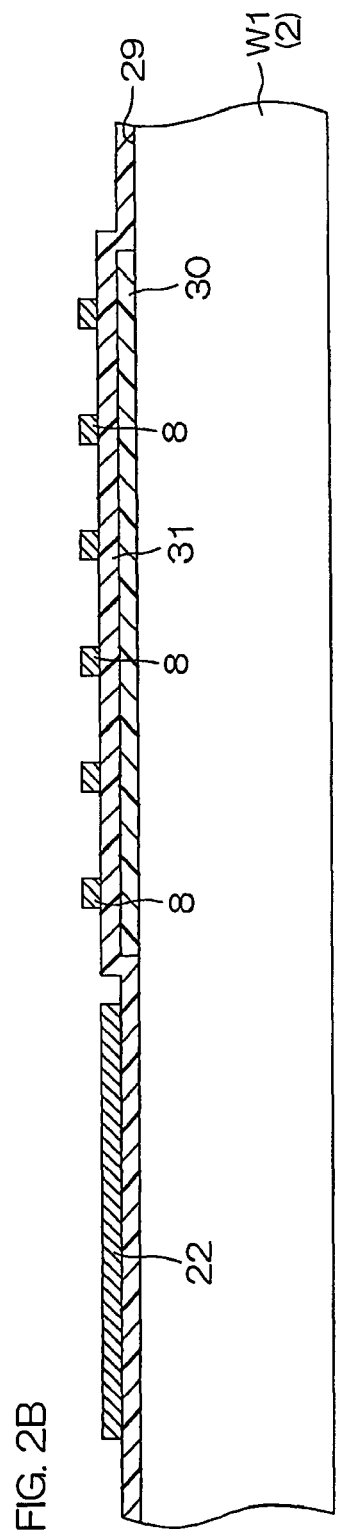

Then, a first insulating layer 31 made of SiO$_2$ is formed on the overall region of the Si wafer W1 including the lower sacrificial layer 30 by PECVD, for example. Then, an Al film is formed on the overall region of the first insulating layer 31 by sputtering, for example. Then, this Al film is patterned by well-known photolithography and etching. Thus, the lower electrode 8 in the form of a mesh in plan view is formed on a position of the upper surface of the first insulating layer 31 opposed to the Si wafer W1 through the lower sacrificial layer 30, as shown in FIG. 2B. On the other hand, the wire 22 of the prescribed pattern is formed on the portion of the first insulating layer 31 directly formed on the upper surface 29 of the Si wafer W1.

Figure 2C:
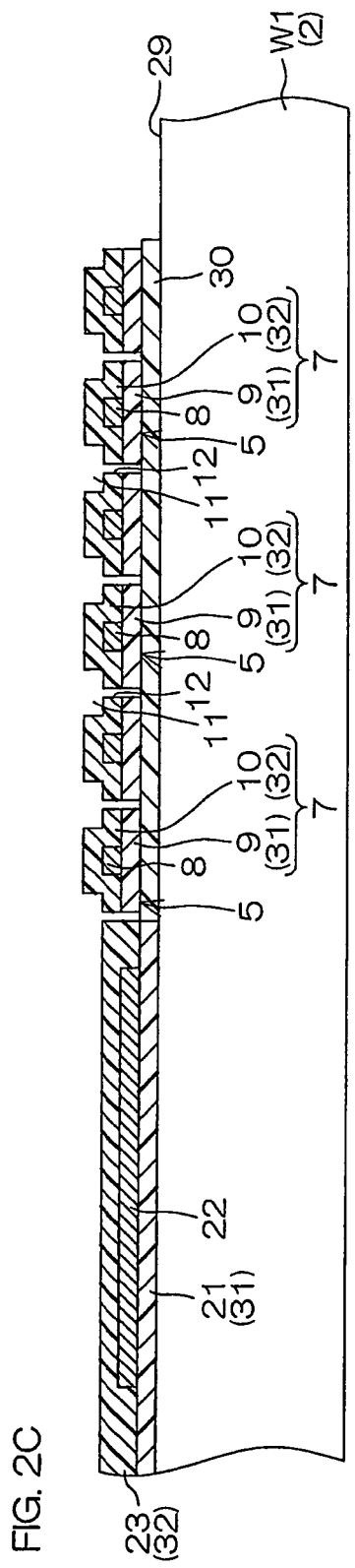

Then, a second insulating layer 32 is formed on the overall region of the first insulating layer 31 including the wire 22 and the lower electrode 8 by PECVD, for example. At this time, portions of the second insulating layer 32 (second insulating layer 10) located on the lower electrode 8 protrude by the thickness of the lower electrode 8, whereby the recesses 11 are formed between the adjacent ones of the protruding portions. Then, the second insulating layer 32 and the first insulating layer 31 are patterned by well-known photolithography and etching, whereby the lower through-holes 12 are formed to extend from the bottom surfaces of the recesses 11 toward the lower sacrificial layer 30 in the thickness direction. Thus, the portion of the first insulating layer 31 located on the lower sacrificial layer 30 becomes the first insulating layer 9, and the portion of the second insulating layer 32 located on the first insulating layer 9 becomes the second insulating layer 10. The lower thin film 5 having the structure obtained by covering the lower electrode 8 with the lower thin film insulating layer 7 consisting of the first and second insulating layers 9 and 10 is formed on the lower sacrificial layer 30 in this manner, as shown in FIG. 2C (step of forming a lower thin film).

On the other hand, the portion of the first insulating layer 31 directly formed on the upper surface 29 of the Si wafer W1 becomes the first insulating layer 21, and the portion of the second insulating layer 32 located on the first insulating layer 21 becomes the second insulating layer 23 covering the wire 22 along with the first insulating layer 21.

Then, Al is deposited on the overall region of the Si wafer W1 by PECVD, for example. This Al is deposited up to a height for filling up the lower through-holes 12 and a clearance 33 between the lower tin film insulating layer 7 and the second insulating layer 23 and completely covering the lower thin film 5. Then, this Al film is patterned by well-known photolithography and etching. Thus, an upper sacrificial layer 34 made of Al is formed as shown in FIG. 2D (step of forming a sacrificial layer). At this time, recesses 35 are formed in the upper sacrificial layer 34 on positions opposed to the recesses 11, due to the recesses 11 formed in the second insulating layer 10 of the lower thin film 5. Further, recesses 40 dented from the bottom surfaces of the recesses 35 by one step are formed in the upper sacrificial layer 34, due to the lower through-holes 12 formed in the lower thin film insulating layer 7.

Figure 2E:
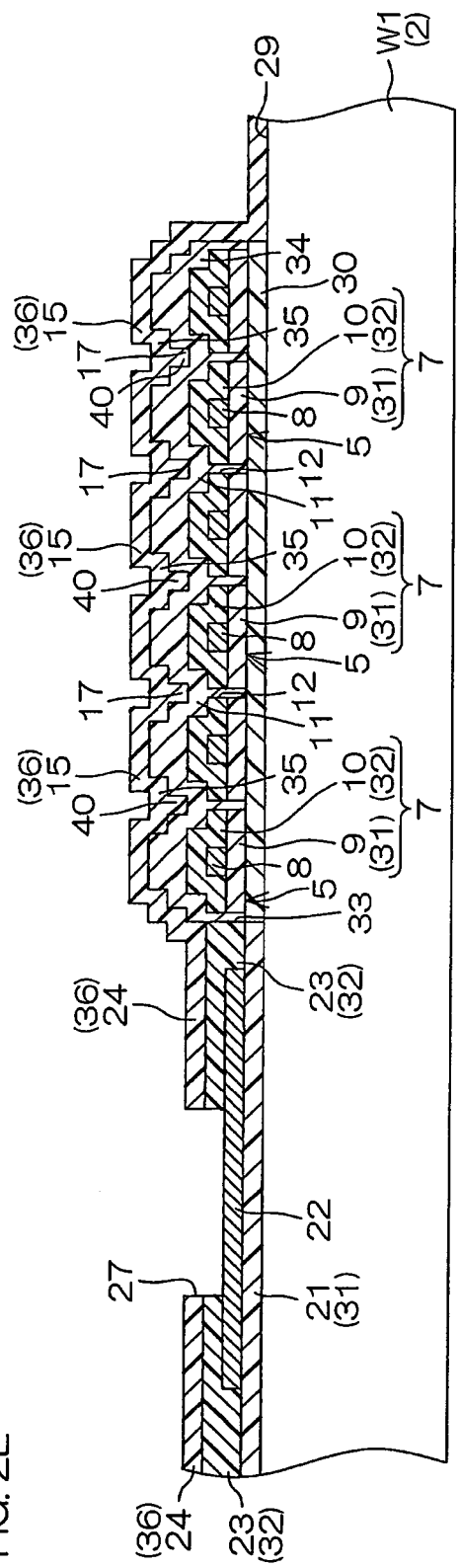

After the formation of the upper sacrificial layer 34, SiO$_2$ is deposited on the overall region of the Si wafer W1 including the upper sacrificial layer 34 by PECVD, for example. This SiO$_2$ is deposited up to a height for entering the recesses 40 and 35 and completely covering the upper sacrificial layer 34. Thus, a third insulating layer 36 is formed by the third insulating layer 15 provided on the upper sacrificial layer 34 and the third insulating layer 24 provided on the second insulating layer 23, as shown in FIG. 2E. Thereafter the third insulating layer 24 and the second insulating layer 23 are partially removed by well-known photolithography and etching, for forming the opening 27 partially exposing the wire 22 as the bonding pad.

Figure 2F:
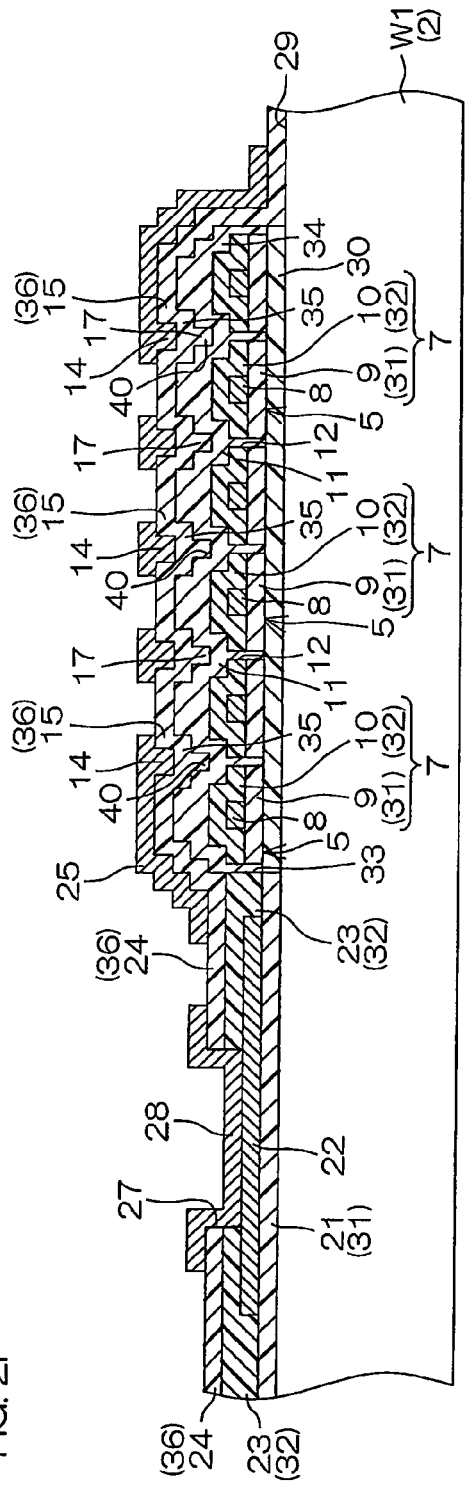

Then, an Al film is formed on the overall region of the third insulating layer 36 by sputtering, for example. Then, the Al film is patterned by well-known photolithography and etching. Thus, the upper electrode 14 in the form of a mesh in plan view is formed on a position of the upper surface of the third insulating layer 15 opposed to the lower thin film 5 through the upper sacrificial layer 34, as shown in FIG. 2F. On the other hand, the wire 25 of the prescribed pattern is formed on the upper surface of the third insulating layer 24. Further, the metal thin film 28 covering the part of the wire 22 exposed from the opening 27 is formed on the opening 27.

Figure 2G:
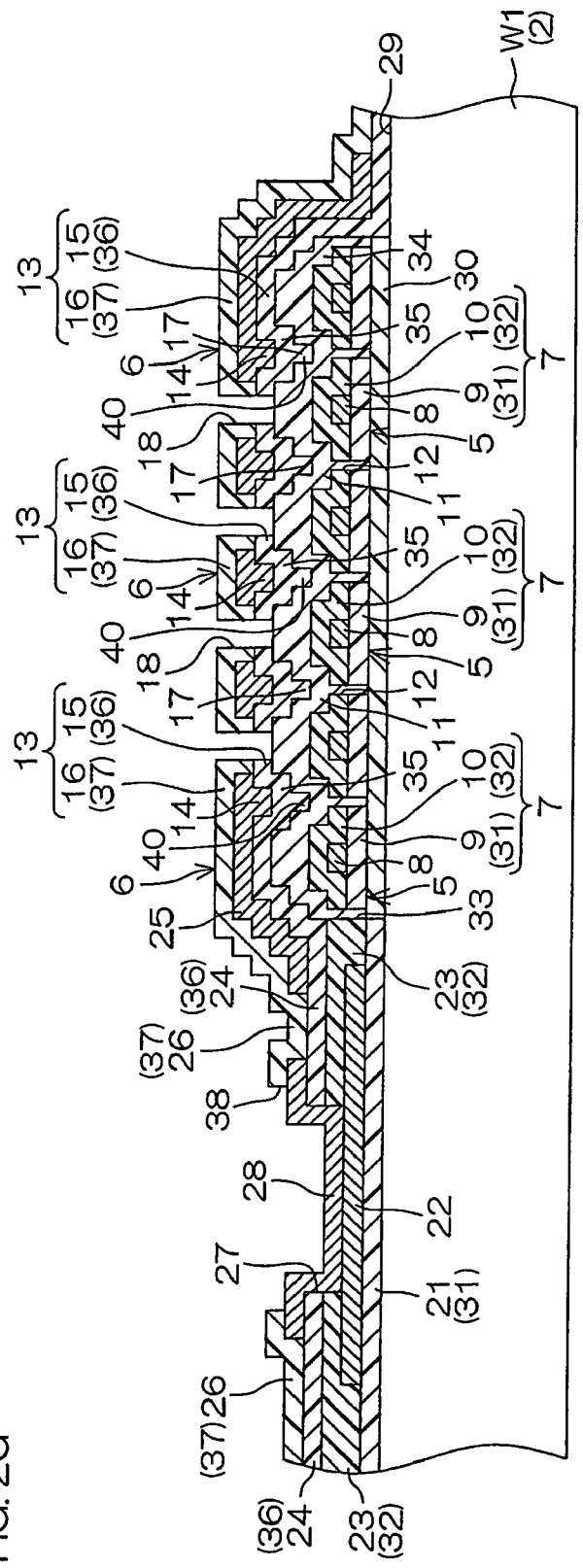

Then, SiO$_2$ is deposited on the overall region of the third insulating layer 36 including the upper electrode 14, the wire 25 and the metal thin film 28 by PECVD, for example. Thus, a fourth insulating layer 37 is formed by the fourth insulating layer 16 provided on the third insulating layer 15 and the fourth insulating layer 26 provided on the third insulating layer 24. Then, the fourth insulating layer 37 and the third insulating layer 36 are patterned by well-known photolithography and etching. Thus, the upper through-holes arranged on the positions deviating from the lower through-holes 12 are formed in the fourth insulating layer 16 and the third insulating layer 15 to extend in the thickness direction thereof up to the upper sacrificial layer 34, as shown in FIG. 2G. The upper thin film 6 having the structure obtained by covering the upper electrode 14 with the upper thin film insulating layer 13 consisting of the third and fourth insulating layers 15 and 16 is formed on the lower thin film 5 in this manner (step of forming an upper thin film). Further, the opening 38 partially exposing the metal thin film 28 is formed in the fourth insulating layer 26.

Then, polyimide employed as the material for the protective layer 39 is applied onto the overall region of the Si wafer W1. This polyimide is applied with a thickness completely covering the structure provided on the Si wafer W1. At this time, the upper sacrificial layer 34 is present between the upper thin film 6 and the lower thin film 5, and the lower sacrificial layer 30 is present between the lower thin film 5 and the Si substrate 2. When polyimide is applied to the upper surface 42 of the upper thin film 6, therefore, the upper thin film 6 and/or the lower thin film 5 is neither deformed nor broken by this application.

Figure 2H:
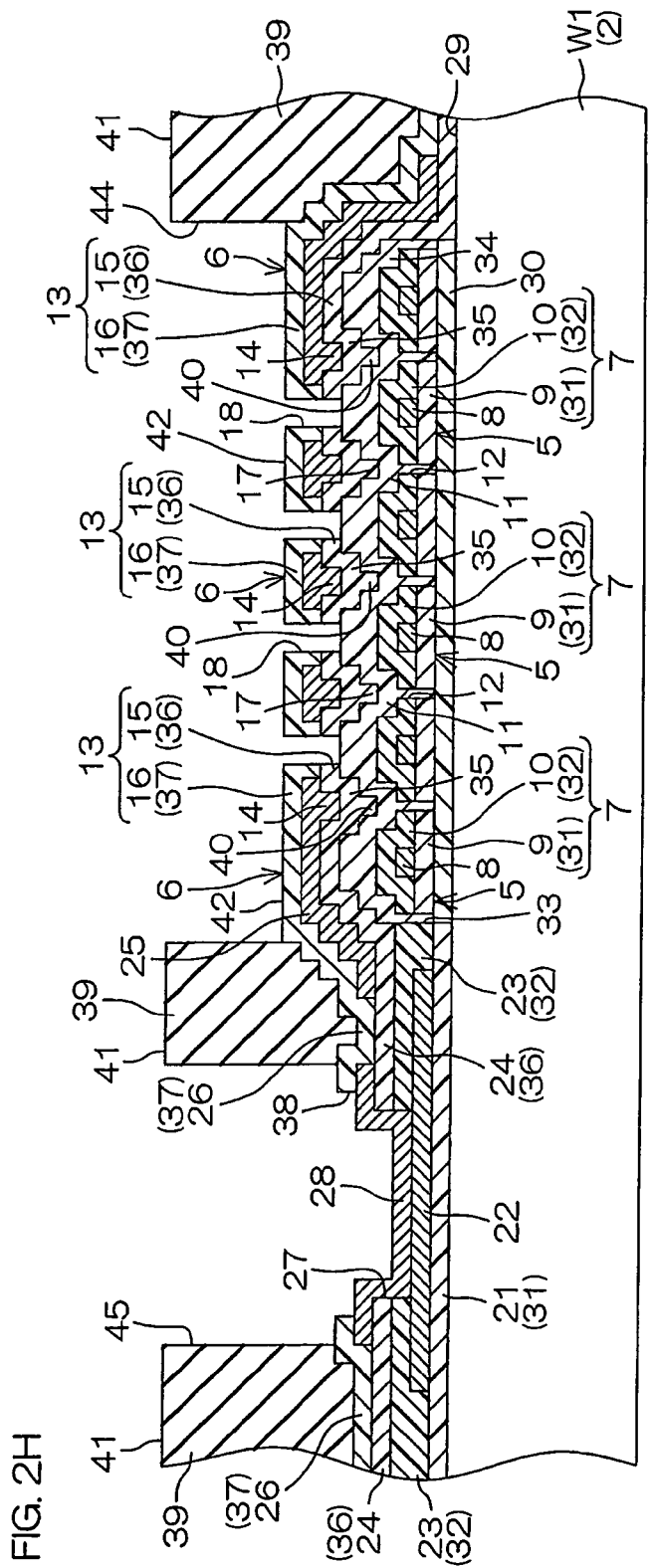

Then, a photomask having an opening in a region other than that for forming the protective layer 39 is arranged on the Si wafer W1. The applied polyimide is exposed through this photomask by well-known exposure. After the exposure of the polyimide, the exposed portion (other than the protective layer 39) of the polyimide is removed by well-known development. Thus, the protective layer 39 having the openings 44 and 45 is formed, as shown in FIG. 2H (step of forming a wall portion).

Figure 2I:
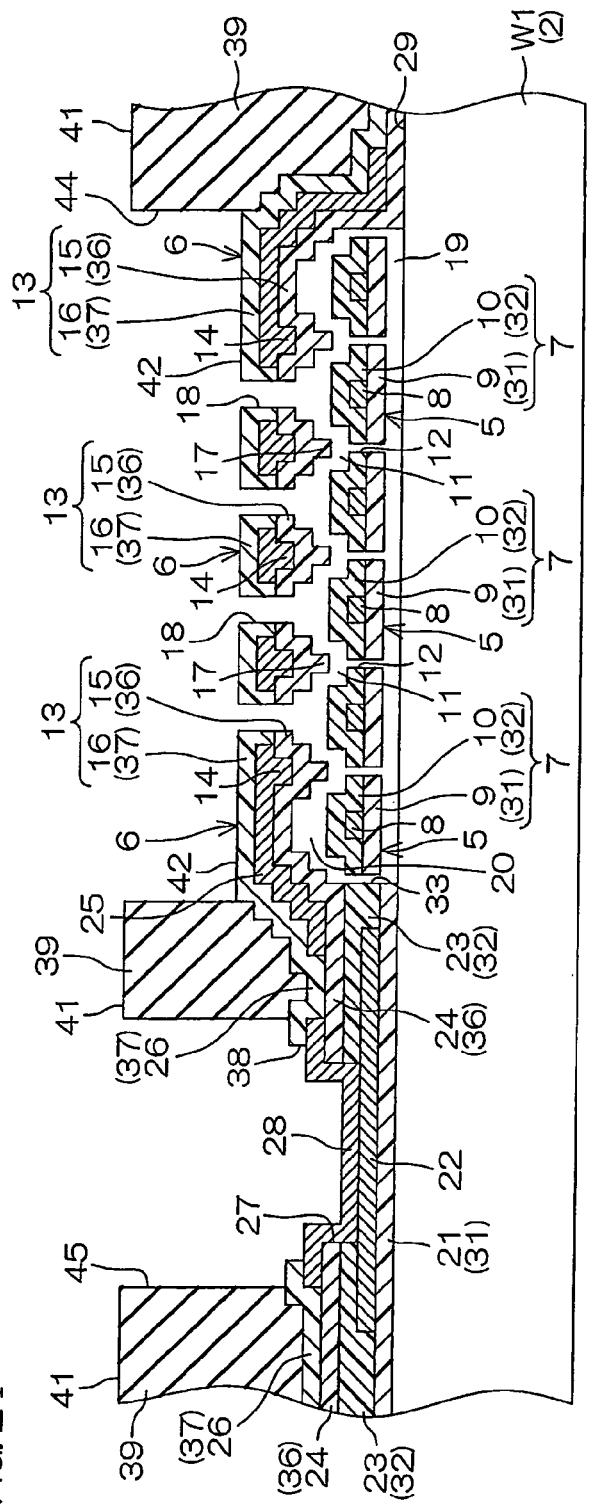

After the formation of the protective layer 39, etching gas (chlorine-based gas such as BCl$_3$ (boron trichloride), for example) is supplied to the upper sacrificial layer 34 through the upper through-holes 18, to dry-etch the upper sacrificial layer 34 (step of removing the sacrificial layer). Thus, the upper sacrificial layer 34 is removed and the cavity 20 is formed between the lower thin film 5 and the upper tin film 6, as shown in FIG. 2I.

Then, the etching gas is supplied to the lower sacrificial layer 30 through the upper through-holes 18, the cavity 20 and the lower through-holes 12, to dry-etch the lower sacrificial layer 30. Thus, the lower sacrificial layer 30 is removed and the cavity 19 is formed between the Si wafer W1 and the lower thin film 5, as shown in FIG. 2I. The polyimide resistant against the etching gas is utilized as an etching mask for removing (etching) the upper and lower sacrificial layers 34 and 30.

Figure 2J:
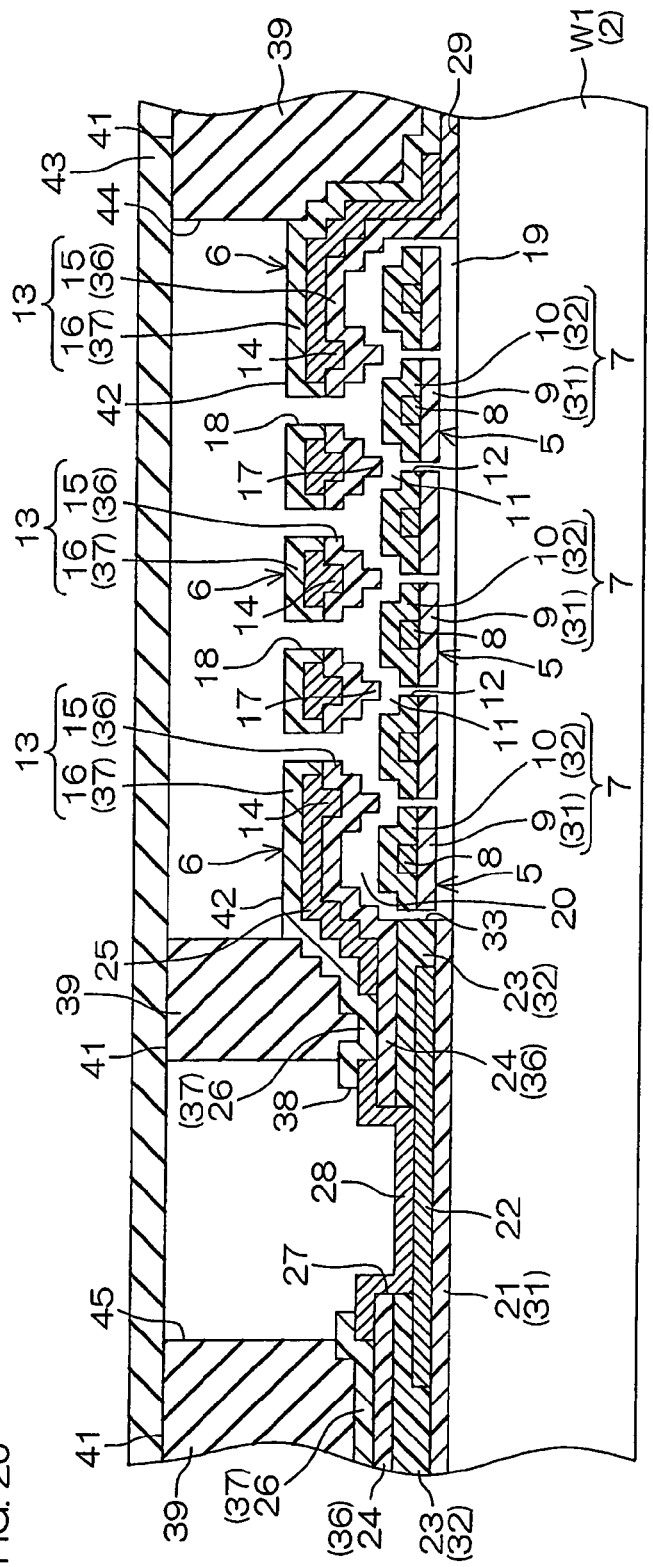
Figure 2K:
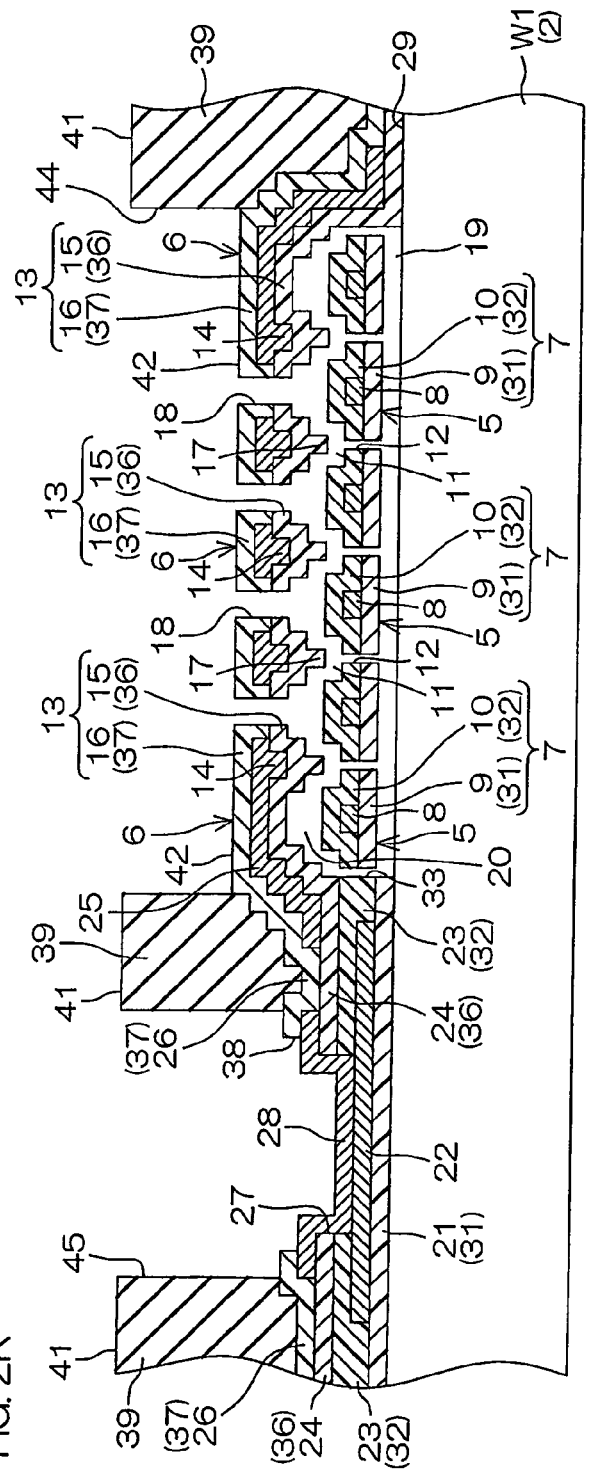
Figure 3B:
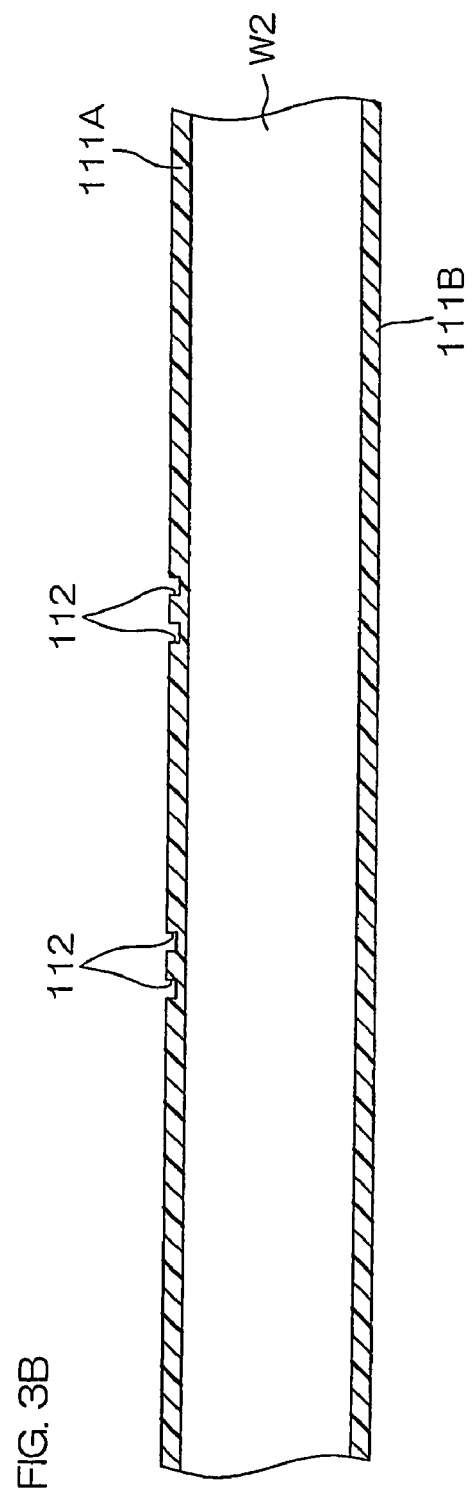
Figure 3E:
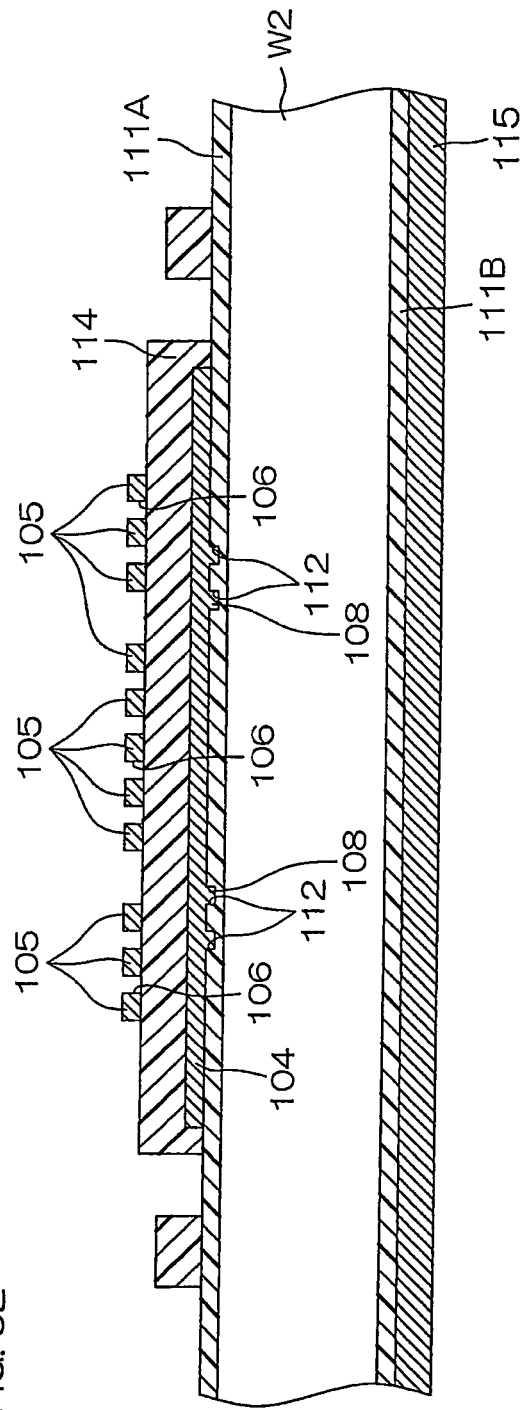
Figure 3I:
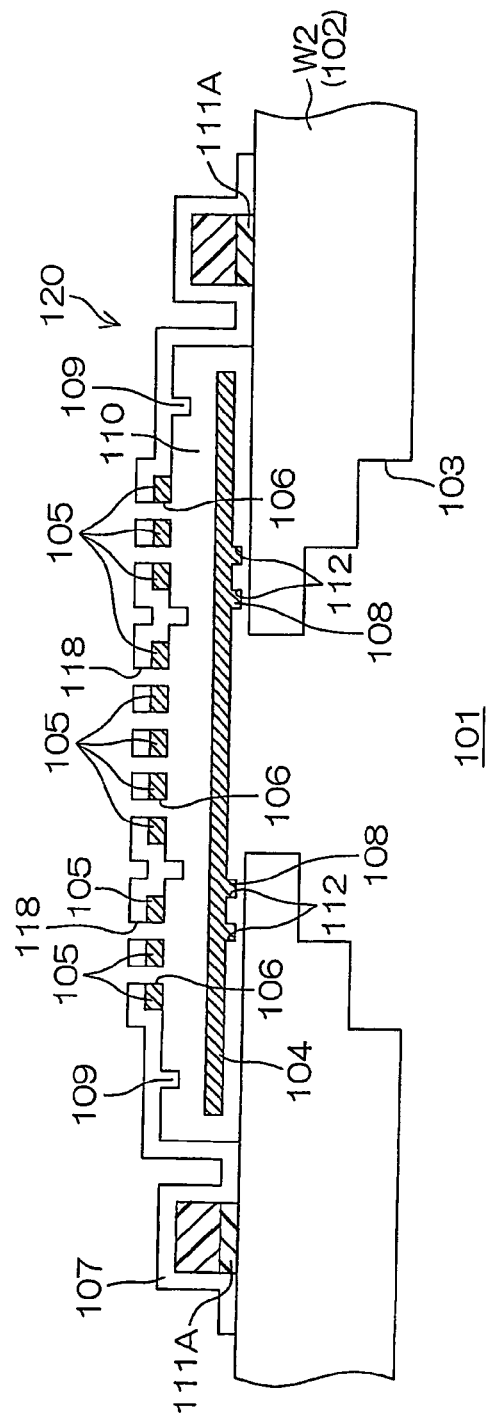

Then, a dicing tape 43 is bonded to the upper surface 41 of the protective layer 39, as shown in FIG. 2J. Thereafter the Si wafer W1 is diced into the size of the Si substrate 2 with a dicing saw along a previously set dicing line (not shown), and the dicing tape 43 having been bonded to the upper surface 41 of the protective layer 39 removed, as shown in FIG. 2K. Thus, the Si microphone 1 shown in FIG. 1 is obtained. The portions of the third insulating layer 15 having entered the recesses 35 and 40 of the upper sacrificial layer 34 become the protrusions 17 protruding toward the recesses 11 (lower through-holes 12), to function as the stoppers for preventing the upper thin film 6 and the lower thin film 5 from retention of contact (adhesion).

According to this embodiment, as hereinabove described, the lower sacrificial layer 30 is formed on the upper surface 29 of the Si wafer W1, and the lower thin film 5 having the plurality of recesses 11 and the plurality of lower through-holes 12 in the form of matrices is formed on the lower sacrificial layer 30. The upper sacrificial layer 34 is formed on the lower thin film 5, and the upper thin film 6 having the plurality of upper through-holes 18 in the form of a matrix communicating with the lower through-holes 12 is formed on the upper sacrificial layer 34. After the formation of the lower thin film 5 and the upper thin film 6, the protective layer 39 is formed to surround the sensor portion 3 and the pad portion 4 consisting of these films 5 and 6. After the upper and lower sacrificial layers 34 and 30 are removed by dry etching, the dicing tape 43 is bonded to the upper surface 41 of the protective layer 39, and the Si wafer W1 is diced into the size of each Si wafer W3 with the dicing saw.

The protective layer 39 is formed around the sensor portion 3, and the upper surface 41 of the protective layer 39 is arranged above the upper surface of the upper thin film 6 (upper surface 42 of the fourth insulating layer 16). Thus, the dicing tape 43 can be bonded to the upper surface 41 of the protective layer 39 without bringing the same into contact with the sensor portion 3 in the step of dicing the Si wafer W1. The dicing tape 43 bonded to the upper surface 41 of the protective layer 39 does not come into contact with the sensor portion 3, whereby the sensor portion 3 is neither deformed nor broken when the dicing tape 43 is separated. Further, the dicing tape 43 is so bonded to the upper surface 41 of the protective layer 39 surrounding the sensor portion 3 that the sensor portion 3 can be covered with the protective layer 39 and the dicing tape 43. When the Si wafer W1 is diced with the dicing saw, therefore, water for cooling the dicing saw can be prevented from splashing the sensor portion 3. In other words, the sensor portion 3 of a thin-film structure formed by the upper and lower thin films 6 and 5 provided on the Si substrate 2 can be protected against the dicing tape 43 and the water for cooling the dicing saw.

Therefore, the Si wafer W1 can be diced by the general method employing the dicing tape 43 and the dicing saw.

The Si microphone 1 diced into the size of each Si substrate 2 includes the protective layer 39 provided around the sensor portion 3, whereby the sensor portion 3 can be protected when the Si microphone 1 is carried or a system employing the Si microphone 1 is assembled, for example.

According to this embodiment, further, the protective layer 39 is made of the photosensitive polyimide which can be patterned by well-known exposure and well-known development, whereby the protective layer 39 can be simply formed.

While the embodiment of the present invention has been described, the present invention can also be carried out in other embodiments.

For example, the protective layer 39 may not be made of polyimide, so far as the same can prevent the sensor portion 3 from coming into contact with another substance.

The protective layer 39 (polyimide) is excellent in shock resistance, heat resistance and insulation resistance may be utilized as a passivation film covering the surface of the Si microphone 1 by covering the structure (including the fourth insulating layers 16 and 26) provided on the Si substrate 2.

The upper and lower sacrificial layers 34 and 30 may alternatively be made of another material such as SiN (silicon nitride), so far as the material can be etched and has an etching selection ratio with the lower thin film insulating layer 7 and the upper thin film insulating layer 13.

The lower thin film insulating layer 7 and the upper thin film insulating layer 13 may alternatively be made of another material such as SiN, for example, so far as the same is an insulating material. When the lower thin film insulating layer 7 and the upper thin film insulating layer 13 are made of a material other than $SiO_2$, the upper sacrificial layer 34 may be made of $SiO_2$.

The MEMS sensor according to the present invention is not restricted to the Si microphone, but may be applied to a pressure sensor or an acceleration sensor operating by sensing a change in capacitance.

Although the embodiments of the present invention are described in detail, these embodiments are merely specific examples used for clarifying the technical contents of the present invention. Therefore, the present invention should not be construed as being limited in any way to these specific examples. The spirit and scope of the present invention are limited only by the scope of the appended claims.

This application corresponds to Japanese Patent Application No. 2007-192204 filed with the Japanese Patent Office on Jul. 24, 2007, the full disclosure of which is incorporated herein by reference.

What is claimed is:

1. An MEMS sensor including:
    a substrate;
    a lower thin film provided on a surface of the substrate;
    an upper thin film opposed to the lower thin film at an interval on the side opposite to the substrate; and
    a wall portion surrounding the lower thin film and the upper thin film, and protruding on the side opposite to the lower thin film with respect to the upper thin film and having an opening exposing the upper thin film, wherein
    the lower thin film has a lower thin film insulating layer and a lower electrode covered with the lower thin film insulating layer.

2. The MEMS sensor according to claim 1, wherein
    the lower thin film insulating layer includes a first insulating layer forming a lower layer of the lower thin film insulating layer and a second insulating layer formed on the first insulating layer as an upper layer of the lower thin film insulating layer.

3. The MEMS sensor according to claim 2, wherein a plurality of recesses is formed in the second insulating layer.

4. The MEMS sensor according to claim 3, wherein
    the lower thin film insulating layer is provided with lower through-holes passing through the lower thin film insulating layer in the thickness direction thereof from the bottom surfaces of the recesses of the second insulating layer.

5. The MEMS sensor according to claim 4, wherein the lower thin film insulating layer is in the form of a rectangular mesh in plan view, with the lower through-holes provided in the form of a matrix in plan view.

6. The MEMS sensor according to claim 1, wherein the lower electrode is in the form of a rectangular mesh in plan view.

7. The MEMS sensor according to claim 1, wherein the lower electrode is supported by a wire at a prescribed interval from the surface of the substrate.

8. An MEMS sensor including:
a substrate;
a lower thin film provided on a surface of the substrate;
an upper thin film opposed to the lower thin film at an interval on a side opposite to the substrate; and
a wall portion surrounding the lower thin film and the upper thin film, and protruding on the side opposite to the lower thin film with respect to the upper thin film and having an opening exposing the upper thin film, wherein
the upper thin film has an upper thin film insulating layer and an upper electrode covered with the upper thin film insulating layer.

9. The MEMS sensor according to claim 8, wherein the upper thin film insulating layer includes a third insulating layer forming a lower layer of the upper thin film insulating layer and a fourth insulating layer formed on the third insulating layer as an upper layer of the upper thin film insulating layer.

10. The MEMS sensor according to claim 9, wherein the third insulating layer is provided with protrusions.

11. The MEMS sensor according to claim 8, wherein the upper thin film insulating layer is provided with a plurality of upper through-holes passing through the upper thin film insulating layer in the thickness direction thereof.

12. The MEMS sensor according to claim 8, wherein the upper electrode is in the form of a rectangular mesh in plan view.

13. The MEMS sensor according to claim 8, wherein the upper electrode is supported by a wire at a prescribed interval from an upper surface of the lower thin film.

* * * * *